(12) United States Patent
Woodruff et al.

(10) Patent No.: US 6,271,568 B1
(45) Date of Patent: Aug. 7, 2001

(54) VOLTAGE CONTROLLED RESISTANCE MODULATION FOR SINGLE EVENT UPSET IMMUNITY

(75) Inventors: Richard L. Woodruff; Jonathan E. Lachman, both of Fort Collins, CO (US)

(73) Assignee: UTMC Microelectronic Systems Inc., Colorado Springs, CO (US)

( * ) Notice: Subject to any disclaimer, the term of this patent is extended or adjusted under 35 U.S.C. 154(b) by 0 days.

(21) Appl. No.: 08/999,346

(22) Filed: Dec. 29, 1997

(51) Int. Cl.[7] .................................................. H01L 27/76
(52) U.S. Cl. ........................ 257/379; 257/536; 257/537; 257/538; 365/154; 365/155; 365/156; 365/190
(58) Field of Search ..................................... 365/154–156, 365/190; 257/536, 537, 538, 379

(56) References Cited

U.S. PATENT DOCUMENTS

| | | |
|---|---|---|
| 5,126,279 | 6/1992 | Roberts . |
| 5,135,882 | 8/1992 | Karniewicz . |
| 5,212,108 | 5/1993 | Liu et al. . |
| 5,268,325 | 12/1993 | Spinner, III et al. . |
| 5,301,146 | 4/1994 | Hama . |
| 5,310,694 | 5/1994 | Houston . |
| 5,594,269 | 1/1997 | Spinner, III et al. . |
| 5,616,951 | 4/1997 | Liang . |
| 5,804,472 * | 9/1998 | Balasinisky et al. ................ 438/238 |

* cited by examiner

Primary Examiner—Fetsum Abraham
(74) Attorney, Agent, or Firm—Morgan & Finnegan, LLP

(57) ABSTRACT

An SRAM cell includes six transistors and two variable resistors. A first pair of transistors form a first inverter, while a second pair of transistors form a second inverter. The remaining two transistors are pass transistors. The inverters are cross-coupled, through the variable resistors, to form a flip flop circuit which stores binary logic states. The variable resistors are formed by doping a portion of a polysilicon layer. Above the doped polysilicon resistor is a thin oxide layer. Disposed above the oxide layer is a thin layer of aluminum or polysilicon, which is connected by metallization. When a positive voltage is applied to the metallization, electrons accumulate in the doped polysilicon resistor, thereby lowering the resistance value of the polysilicon region. This voltage is applied to the interconnect during a write-in cycle, when it is desired to write data to the SRAM cell. The lowered resistance value of the polysilicon resistor allows for relatively fast write-in times for the SRAM cell. At all other times, no voltage is applied to the interconnect. As such, the resistance value of the doped resistor polysilicon region remains at a relatively high value, thereby providing for a high RC time delay and increased immunity to soft errors or single event upsets which may be caused by ionizing radiation.

38 Claims, 1 Drawing Sheet

VOLTAGE CONTROLLED RESISTANCE MODULATION FOR SINGLE EVENT UPSET IMMUNITY

TECHNICAL FIELD

This invention relates to integrated circuits ("ICs"), and more particularly to the design of a six transistor static random access memory ("SRAM") cell having increased immunity to errors in the stored logic state that may result due to exposure of the memory cell to high energy particle radiation.

BACKGROUND ART

SRAM devices are well-known and widely-used to store data in binary form (i.e., either the binary "0" or "1" logic states). In general, a static memory device is one which retains the stored binary logic state at all times when electrical power is applied to the device. Further, a randomly-accessible static memory device (i.e., an SRAM) is one that allows random access to any of the device's plurality of memory cells. Generally, the access time is the same for every cell in the device.

A well-known and widely-used single SRAM data storage cell is constructed from six metal oxide semiconductor ("MOS") transistors and two cross-coupled, inter-nodal resistors. This memory cell structure is duplicated literally thousands of times on a semiconductor IC substrate to form an SRAM device. A first pair of transistors form a first inverter, while a second pair of transistors form a second inverter. The output node of the first inverter is connected to the input node of the second inverter through a feedback resistor. Similarly, the output node of the second inverter is connected to the input node of the first inverter through a feedback resistor. The output node of each inverter is also connected to a corresponding pass or transfer transistor to connect that node to a bit line for selective reading and writing of the particular logic states currently stored in the memory cell. The two inverters, together with the feedback resistors, form a flip-flop circuit for storing data. One inverter stores either one of the two binary logic states, while the second inverter stores the opposite logic state.

The two feedback, cross-coupled or inter-nodal resistors are used to increase the resistive-capacitive ("RC") time delay which results from the inherent resistances and capacitances associated with, e.g., the routing lines and gate terminals of the inverter transistors. Generally, a relatively large RC time delay is desirable to prevent the SRAM memory cell from switching logic states when the cell is exposed to ionizing radiation. This could occur when the SRAM is utilized in a space or nuclear environment. However, the RC time delay cannot be so large as to unduly lengthen the time it takes to write data to the SRAM cell.

The ionizing radiation consists of charged particles which strike certain nodes (i.e., connection points) between the elements within the SRAM circuit. The generated electron/hole pairs can collect at a node in an amount that exceeds the critical amount of charge needed to keep the node at the currently-stored logic state. When excess charge is accumulated at, e.g., an output node of an inverter, charge can propagate to an input node of the opposite inverter. There, the charge can accumulate in an amount that can undesirably "upset" or switch the logic states currently stored in the SRAM memory cell. This inadvertent switching is referred to as a "single event upset" ("SEU") or a "soft error". The immunity of the SRAM memory cell to such errors is generally referred to as its "radiation hardness" capability or SEU immunity. The feedback resistors are typically a relatively high value (e.g., 250 k ohms), to limit the amount of charge that can undesirably propagate between nodes.

However, the use of such inter-nodal resistors in an SRAM cell is not without its drawbacks. Typically, the six transistors are fabricated in a first layer of polycrystalline silicon ("polysilicon") as part of the IC, while the two resistors are fabricated in a second polysilicon layer. See, for example, U.S. Pat. No. 5,135,882. This second layer of polysilicon adds considerable complexity to the IC processing steps in fabricating the SRAM device, along with topology problems in the resulting IC structure.

There are known prior art attempts at locating the six transistors and the two resistors of an SRAM memory cell within a single layer of polysilicon. See, for example, U.S. Pat. No. 5,126,279, which teaches the use of a salicide isolating mask layer to form the resistors and transistors in the same polysilicon layer. However, the single polysilicon layer approach has a number of manufacturability drawbacks, especially as device dimensions continually shrink in an attempt to achieve higher device integration levels. For example, one drawback is the reported inability to accurately control the grain-boundary-assisted diffusion between the heavily-doped transistor gate regions and the lightly-doped resistor regions within the single polysilicon layer. Any unwanted diffusion can significantly alter the sheet resistance of the resistor regions formed in the polysilicon layer. Another drawback is the reported inability to vary the thickness of the resistor region of the polysilicon layer independently of the gate region of the same polysilicon layer. See the aforementioned U.S. Pat. No. 5,135,882.

Regardless of whether or not the SRAM polysilicon resistors are formed in the same polysilicon layer as the transistors, there exists an inherent problem with resistors formed by polysilicon doping. Polysilicon resistors have relatively large voltage and temperature coefficients, which result in very large resistance values at low temperatures and small resistance values at high temperatures. Thus, at high SRAM device operating temperatures, the RC time delay may not be adequate enough to prevent soft errors. The typical solution is to increase the resistance values of the feedback resistors so that there exists a large enough RC time delay at high temperatures.

However, the downside to this approach is that there exists an even larger RC time delay at low temperatures, which could be excessive. An excessively large RC time delay can lead to unduly long time delays in writing data to the SRAM cell. In other words, a feedback resistor value adequate to provide SEU immunity at +125 degrees C will severely limit the speed in which SRAM cell may be written at −55 degrees C, thereby reducing the overall speed rating of the SRAM device.

One known attempted solution to the time delay problem associated with the memory write-in cycle is described and illustrated in U.S. Pat. No. 5,301,146 ("the '146 patent"). The '146 patent teaches the use of a transistor placed across a feedback resistor, together with added control logic for switching the transistor on and off. However, it should be noted that nowhere in the '146 patent is there mention of the feedback resistors being formed from polysilicon. As a result, nowhere in the '146 patent is there recognition of the aforementioned problem of the relatively large temperature coefficient of the polysilicon resistors. Instead, the underlying premise of the '146 patent is simply that the value of the feedback resistors, while large enough to provide adequate RC time delay, may be so large as to hinder the write-in speed of the SRAM cell. The '146 patent puts forth several related embodiments for selectively lowering the value of the feedback resistors during a memory cell write-in cycle. At all other times, the value of the feedback resistors is purportedly large enough to provide sufficient RC time delay and resulting immunity to soft errors.

In operation, all of the embodiments of the '146 patent are such that, when it is desired to write data to an SRAM cell, the added control logic turns on the transistor connected across the feedback resistor (or turns on the transistor acting as the feedback resistor itself). This lowers the effective value of the feedback resistance, thereby lowering the write-in time for the SRAM cell. During all other times, the added control logic keeps the transistor off. This keeps the feedback resistor at its high value, which insures an adequate RC time delay to prevent the occurrence of soft errors.

However, the obvious problem with the scheme described in U.S. Pat. No. 5,301,146 is space taken up by the added transistors and control logic. What is desired is simpler structural approach to selectively lowering the RC time delay during memory write cycles while keeping the RC time delay adequately high enough at all other times to provide sufficient protection against soft errors.

DISCLOSURE OF INVENTION

Objects of the present invention include the provision of adequate immunity or radiation hardness, across a wide temperature range of an SRAM memory cell, to charged particle radiation, while selectively lowering the time to write data to the memory cell.

According to the invention, each of the two feedback resistors within a six transistor SRAM memory cell is formed in the same layer of polysilicon as the transistor gate terminals. The polysilicon layer is appropriately masked and doped to form the transistor regions and the resistor regions. A thin oxide layer is formed over the polysilicon resistor regions. Next, either a thin aluminum layer or a thin polysilicon layer is formed over the oxide layer. The aluminum or polysilicon layer is patterned leaving the aluminum or polysilicon disposed entirely over only the polysilicon resistor region. A metal interconnect is formed in contact with the aluminum or polysilicon layer.

In operation, when it is desired to write data to the SRAM memory cell, a voltage is applied to the metal interconnect. This causes an accumulation of electrons in the polysilicon resistor region. This lowers the effective resistance value of the feedback resistors, thereby reducing the RC time delay and the time to write data to the cell. In contrast, when the SRAM is not in the write mode, there is little or no voltage applied to the metal interconnect, which keeps the effective resistance value of the feedback resistors at a high value. This provides adequate RC time delay and resulting adequate immunity to soft errors. Therefore, essentially the polysilicon resistor regions function as voltage-modulated or controlled resistance values. However, as compared to the aforementioned scheme described and illustrated in U.S. Pat. No. 5,301,146, the structure of the present invention is much simpler, utilizing less complicated processing steps and a much simpler device topology.

BEST MODE FOR CARRYING OUT THE INVENTION

Figure 1:
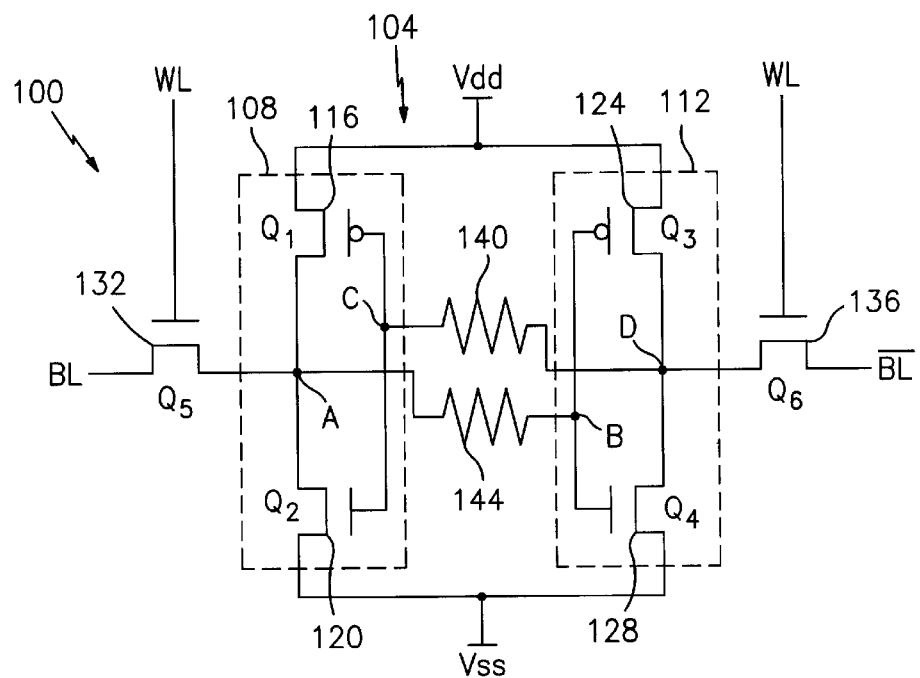
FIG. 1 is a schematic illustration of a six transistor SRAM memory cell, including two feedback resistors formed in accordance with the present invention.

FIG. 1 illustrates the SRAM memory cell 100 of the present invention including a flip-flop circuit 104 comprised of a pair of inverters 108,112. The first inverter 108 comprises a P-channel MOS transistor Q1 116 and an N-channel MOS transistor Q2 120. The second inverter 112 comprises a P-channel MOS transistor Q3 124 and an N-channel MOS transistor Q4 128. The source terminal of each P-channel transistor Q1,Q3 116,124 is connected to a first voltage level, Vdd, typically positive five volts. The source terminal of each N-channel transistor Q2,Q4 120,128 is connected to a second voltage level Vss, typically electrical ground. The drain terminal of each transistor Q1,Q2 116,120 is connected at the node labeled "A" in FIG. 1. Node A forms the output node of the first inverter 108. The drain terminal of each transistor Q3,Q4 124,128 is connected at the node labeled "D" in FIG. 1. Node D represents the output node of the second inverter 112.

The gate terminal of transistor Q1 116 is connected to the gate terminal of transistor Q2 120 at the node labeled "C" in FIG. 1. Node C is the input node for the first inverter 108. The gate terminal of transistor Q3 124 is connected to the gate terminal of transistor Q4 128 at the node labeled "B" in FIG. 1. Node B is the input node of the second inverter 112.

The output node A of the first inverter 108 is connected to the source terminal of an N-channel transistor Q5 132. The drain terminal of transistor Q5 132 is connected to the bit line, BL, which represents an input/output line for reading or writing data from or to the first inverter 108. The transfer or pass transistor Q5 132 is controlled by a voltage applied to the gate terminal on the word line, WL. The word line is used to address a certain SRAM memory cell 100 within an array of cells 100. Although not shown in the figures, the SRAM cell 100 of FIGS. 1 and 2 can be duplicated literally thousands of times to form an array of cells 100.

Similarly, the output node D of the second inverter 112 is connected to a source terminal of pass transistor Q6 136. The drain terminal of this transistor 136 is connected to the bit line, BL/, which, in normal SRAM cell 100 operation, contains the opposite logic state as that on the bit line, BL. The word line, WL, is applied to the gate terminal of pass transistor Q6 136.

A first variable resistor 140 is connected between node C, the input node of the first inverter 108, and node D, the output node of the second inverter 112. A second variable resistor 144 is connected between node A, the output node of the first inverter 108, and node B, the input node of the second inverter 112. The two resistors 140,144 are formed with variable resistance values in accordance with the present invention, as described in detail hereinafter. The two resistors 140,144 provide the cross-coupling between the two inverters 108,112 that comprise the flip flop circuit 104. The primary purpose of each resistor 140,144 is to provide an RC time constant between the output node of one inverter and the input node of the other inverter, to reduce the susceptibility of the cell 100 to soft errors.

Typical operation of the SRAM memory cell 100 of the present invention is as a bi-stable logic device. The output nodes A, D of the corresponding inverters 108,112 have a voltage level of either Vdd or Vss volts. When one inverter has an output voltage level of Vdd on its output node, the other inverter has the opposite voltage level of Vss on its output node.

In an example of steady-state SRAM cell 100 operation, if output node A is logic "high" (i.e., Vdd), transistor Q4 128 is turned on while transistor Q3 124 is turned off. As such, output node D of the second inverter 112 is logic "low" (i.e., Vss). Since output node D is coupled back through resistor 140 to input node C, transistor Q1 116 is on while transistor Q2 120 is off, thereby maintaining output node A at a logic high level.

The two pass transistors Q5,Q6 132,136 are utilized when addressing the cell 100 for writing and reading data to and from the cell. When the word line, WL, is logic high, the transistors Q5,Q6 132,136 are turned on and the output node A of the first inverter 108 is coupled to the bit line, BL while the output node of the second inverter 112 is coupled to the bit line, BL/. The cell 100 may then have data written to or read from using the bit lines BL and BL/.

For example, if it is desired to change the stored logic state of the cell 100, logic levels opposite to those currently on the bit lines, BL and BL/, are placed on those bit lines. The flip flop circuitry 104 then stores the new steady-state values in the inverters 108,112.

As mentioned hereinbefore, a soft error or SEU may occur if the SRAM memory cell 100 is exposed to ionizing radiation. This happens if the SRAM cell 100 is utilized in a space or nuclear environment containing charged particles. For example, if a charged particle (e.g., an alpha particle) impacts output node A of the first inverter 108, then hole-electron pairs could be generated in the underlying silicon substrate of the cell 100, due to the ionization of the lattice along the charged particle track. These hole-electron pairs could allow the charge on output node A to partially or completely dissipate. The charge on output node A could propagate to input node B faster than transistor Q1 116 could recharge output node A. If the charge on output node A drops to near 0 volts, then the charge on input node B would be pulled rapidly to near zero volts. This could cause transistor Q3 124 to turn on and transistor Q4 128 to turn off. As a result, output node D and input node C would then be charged to Vdd, turning transistor Q1 116 off and transistor Q2 120 on. Essentially, the logic states stored by the flip flop circuitry 104 would then be reversed from the previous steady-state operation. By definition, a soft error or an SEU has occurred.

The effect of the relatively large values (e.g., 100 K ohms in a preferred exemplary embodiment) for the variable resistors 140,144 is to lengthen the RC time constant between the input node of one inverter and the output node of the other inverter. The RC time constant is determined in part by all of the gate capacitances of the inverter transistors, together with the chosen values for the resistors 140,144. If the RC time constant is large enough, then if a charged particle strikes an output node of an inverter 108,112, the charge on the output node will not have sufficient time to propagate to the input node of the other inverter. However, as mentioned hereinbefore, the problem with large values for polysilicon feedback resistors 140,144 is the relatively large temperature and voltage coefficients and resulting susceptibility of the cell 100 to soft errors at high temperatures.

The present invention solves this long-felt prior art problem by providing for selectively-modulated, variable resistance values for the two inter-nodal, cross-coupled resistors 140,144. In operation, when the word line, WL, is asserted to address a particular SRAM memory cell 100, the resistance values of the two polysilicon resistors 140,144 attain a relatively low value, thereby lowering the overall RC time constant of the flip flop circuitry 104. By lowering the RC time constant, a relatively fast write-in time is provided for the memory cell 100. On the other hand, when that particular SRAM cell 100 is not addressed by the word line, WL, the resistance values of the two polysilicon resistors 140,144 assume a relatively high value, to provide a relatively large RC time delay and corresponding adequate immunity to soft errors.

Figure 2:
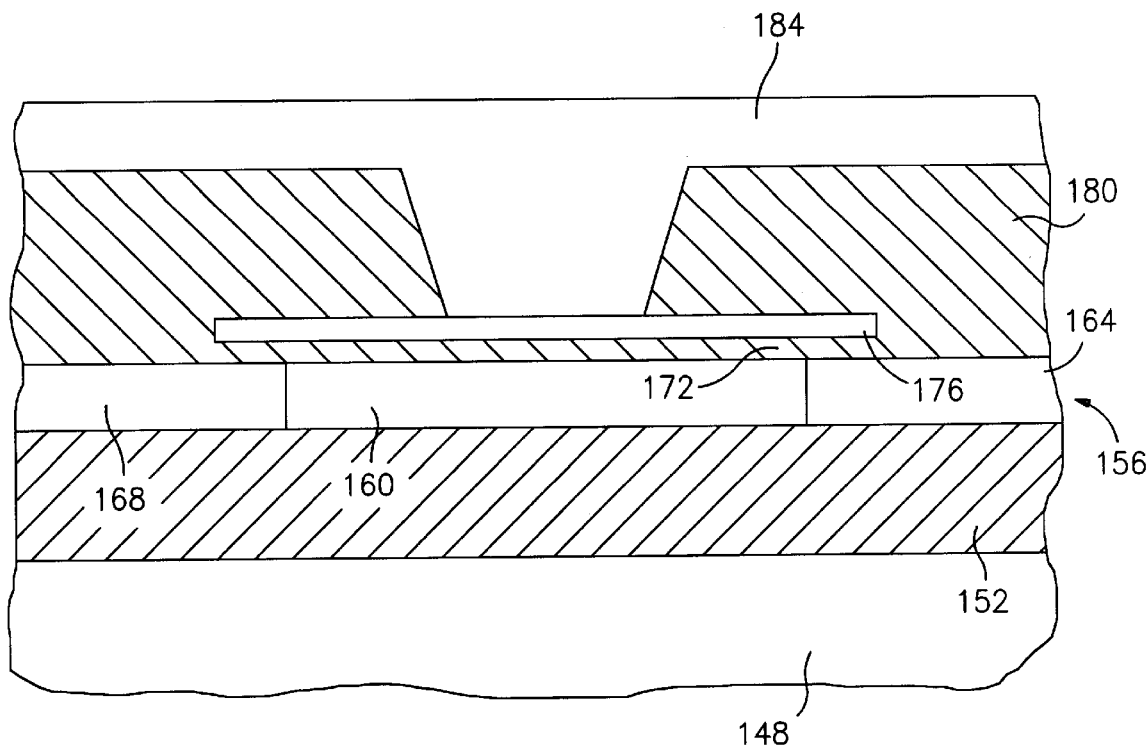
FIG. 2 is a cross-sectional illustration of a portion of a silicon substrate having a polysilicon feedback resistor of FIG. 1 formed therein in accordance with the present invention.

FIG. 2 illustrates a portion of the six-transistor SRAM memory cell 100 of FIG. 1 according to the present invention. In a preferred exemplary embodiment, a bulk silicon substrate 148 has an overlying insulating layer 152. On top of the insulating layer 152 is a polysilicon layer 156. This arrangement of layers 148–156 defines a well-known silicon-on-insulator ("SOI") semiconductor substrate within which the polysilicon resistors 140,144 of the present invention are formed, as described in detail hereinafter. However, it is to be understood that the polysilicon resistors 140,144 may be formed within other types of semiconductor substrates, such as a bulk silicon substrate, in light of the teachings herein, without departing from the broadest scope of the present invention.

FIG. 2 illustrates one portion of the polysilicon layer 156 containing three separately-doped segments. A center segment is doped N-using either phosphorous or arsenic implanted into the polysilicon layer 156 at a dose ranging from $1\times10^{13}$ to $1\times10^{16}$ atoms per cubic centimeter, and at an energy ranging from approximately 15,000 electron volts ("15 keV") to 60 keV. In a preferred embodiment, the dopant species is phosphorous, the dose is $1\times10^{14}$ atoms per cubic centimeter, and the energy is 30 keV.

This moderate dosage for the center segment 160 of the polysilicon layer 156 ultimately forms either one of the variable resistors 140,144 of FIG. 1. The center resistor segment 160 may be formed, using known masking and implantation techniques, following the formation of a pair of segments 164,168. The segments flank each side of the center segment 160 and comprise a more heavily-doped polysilicon implant. The outer segments 164,168 form the gate terminals (or other terminals) of the corresponding six transistors Q1–Q6 116–136 of the SRAM memory cell 100. The outer segments are preferably doped with either phosphorous or arsenic at a doping level of $1\times10^{19}$ to $1\times10^{20}$ atoms per cubic centimeter. Not shown in FIG. 2 are the other remaining terminals of the transistors Q1–Q6 116–136 formed in the polysilicon layer 156 using known techniques.

After the three segments 160–168 have been formed in the polysilicon layer 156, the substrate may then be either thermally oxidized or annealed followed by a deposited oxide to form a thin oxide layer 172 directly above the center segment 160. The preferred thickness of the oxide layer 172 is approximately 50–200 Angstroms.

At this point, the process of forming the resistors 140,144, according to the present invention, can follow either one of two paths. In a first preferred embodiment, a thin aluminum layer 176 is deposited over the thin oxide layer 172. Preferably, the thickness of the aluminum ranges from approximately 500 to 5000 Angstroms, with a preferred thickness of 1000 Angstroms. The aluminum layer 176 is then patterned and etched leaving the metal entirely over only the center resistor segment 160 of the polysilicon layer 156. In an alternative embodiment, polysilicon replaces the aluminum comprising the layer 176 above the oxide layer 172.

Next, an additional silicon dioxide layer 180 is deposited or formed on top of both the polysilicon layer 156 and the aluminum or polysilicon layer 176. The oxide layer 180 blends with the thin oxide layer 172 to form one contiguous layer of oxide. This inter-level dielectric oxide layer 180 is then etched at appropriate points to form voids. The voids are then filled with appropriate metal interconnect material, such as aluminum, thereby forming interconnecting vias. A first metallization layer 184 comprising, e.g., aluminum, may be deposited on top of the vias and on top of the oxide layer 180.

Preferably, the first metallization layer 184 is connected to the word line, WL. In operation, when a positive voltage is applied to the word line and to the metal interconnect 184 during the write cycle of the SRAM memory cell 100, electrons accumulate in the center segment 160 of the polysilicon layer 156 that comprises the feedback resistors 140,144. The accumulation of electrons lowers the resistance value of the center segment 160 of the polysilicon layer 156, thereby reducing the RC time constant during the write-in cycle of the SRAM cell 100. On the other hand, when the SRAM memory cell 100 is not in the write mode, no voltage is applied to the metal interconnect 184. The center segment 160 of the polysilicon layer 156 is then at its normal relatively high resistance value, as given by the doping of that segment 160. As such, the center segment 160 provides for a relatively high RC time constant, thereby providing for immunity to soft errors.

It can be seen from the foregoing that the resistors 140,144 are essentially voltage modualted resistors. However, as compared to the resistance modulation schemes employed in the aforementioned U.S. Pat. No. 5,301,146, the doped polysilicon resistors of the present invention do not require additional devices such as transistors to be connected thereacross. Also, the resistors 140,144 of the present invention are simpler in that they are not formed as transistors, as taught in alternative embodiments of the '146 patent.

The resistors 140,144 of the present invention have been described and illustrated herein for use in an SRAM cell 100 having a pair of inverters 108,112, each inverter comprising two transistors. However, it is to be understood that the invention is not limited as such. The resistors 140,144 of the present invention may be utilized in any type of circuit where it is desired to provide for a voltage modulated resistance value. The circuit does not have to be a memory circuit. Yet, if used in a memory circuit, such memory may comprise the well-known dynamic random access memory ("DRAM"). Further, if utilized in an SRAM, the SRAM can have a configuration other than those described herein. For example, the SRAM circuit may comprise two inverters, each inverter having only one transistor, along with a load device (e.g., a resistor).

Still further, the invention has been described as utilizing the word line, WL, as comprising a voltage signal applied to the metal interconnect 184 when it is desired to lower the resistance of the variable resistor. However, this is purely exemplary. Other available signals may be applied to the metal interconnect 184, for example, a write signal or any other signal typically applied to the memory cell during a write cycle.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:
1. Electrical circuitry, comprising:
   first inverter means, having an input node and an output node, for storing any one of two different binary logic states;
   second inverter means, having an input node and an output node, for storing an opposite one of the any one of the two binary logic states stored by the first inverter means;
   first variable resistance means, connected between the output node of the first inverter means and the input node of the second inverter means, wherein the first variable resistance means comprises a first region of silicon doped with an impurity to form a predetermined resistivity, and the resistivity of the first variable resistance means can be varied by applying an electrical charge over the first region of silicon in accordance with a first voltage signal; and
   second variable resistance means, connected between the output node of the second inverter means and the input node of the first inverter means, wherein the second variable resistance means comprises a second region of silicon doped with an impurity to form a predetermined resistivity, and the resistivity of the second variable resistance means can be varied by applying an electrical charge over the second region of silicon in accordance with a second voltage signal.

2. The electrical circuitry of claim 1, further comprising first transfer means connected to the output node of the first inverter means, wherein the first transfer means receives the first voltage signal for controlling transfer of a voltage signal output by the first inverter means.

3. The electrical circuitry of claim 1, further comprising second transfer means connected to the output node of the second inverter means, wherein the second transfer means receives first voltage signal for controlling transfer of a voltage signal output by the second inverter means.

4. The electrical circuitry of claim 1, wherein the first inverter means comprises a first transistor having a gate terminal, a source terminal and a drain terminal, and the first inverter means further comprises a second transistor having a gate terminal, a source terminal and a drain terminal, wherein the gate terminal of the first transistor is connected to the gate terminal of the second transistor, wherein the drain terminal of the first transistor is connected to the drain terminal of the second transistor, and wherein the source terminal of the first transistor is connected to a first voltage potential and the source terminal of the second transistor is connected to a second voltage potential, and wherein the drain terminal of the first transistor is connected to the drain terminal of the second transistor to form an output node of the first inverter means, wherein the output node of the first inverter means is connected to the first transfer means.

5. The electrical circuitry of claim 4, wherein the first and the second variable resistance means are formed in the same silicon layer as the gate terminals of the first transistor and the second transistor.

6. The electrical circuitry of claim 1, wherein the first variable resistance means comprises a region of silicon doped with an impurity comprising boron.

7. The electrical circuitry of claim 1, wherein the first variable resistance means comprises a region of silicon doped with an impurity comprising phosphorous.

8. The electrical circuitry of claim 1, wherein the second variable resistance means comprises a region of silicon doped with an impurity comprising boron.

9. The electrical circuitry of claim 1, wherein the second variable resistance means comprises a region of silicon doped with an impurity comprising phosphorous.

10. The electrical circuitry of claim 1, wherein the first voltage signal and the second voltage signal are the same.

11. The electrical circuitry of claim 1 further comprising an insulator layer located above the first variable resistance means and below an electrically conductive region.

12. The electrical circuitry of claim 11 wherein the insulator layer is a dielectric oxide.

13. A memory device, comprising:
   a flip flop comprising first inverter means, having an input node and an output node, for storing any one of two different binary logic states, the flip flop further comprising second inverter means, having an input node and an output node, for storing an opposite one of the any one of the two binary logic states stored by the first inverter means; and first variable resistance means, connected between the output node of the first inverter means and the input node of the second inverter means, wherein the first variable resistance means comprises a first region of silicon doped with an impurity to form a predetermined resistivity, and the resistivity of the first variable resistance means can be varied by applying an electrical charge over the first region of silicon in accordance with a first voltage signal.

14. The memory device of claim 13, further comprising: second variable resistance means, connected between the output node of the second inverter means and the input node of the first inverter means, wherein the second variable resistance means comprises a second region of silicon doped with an impurity to form a predetermined resistivity, and the resistivity of the first variable resistance means can be varied by applying an electrical charge over the second region of silicon in accordance with a second voltage signal.

15. The memory device of claim 14, wherein the first variable resistance means comprises a region of polycrystalline silicon doped with an impurity comprising boron.

16. The memory device of claim 14, wherein the first variable resistance means comprises a region of silicon doped with an impurity comprising phosphorous.

17. The memory device of claim 14, wherein the second variable resistance means comprises a region of silicon doped with an impurity comprising boron.

18. The memory device of claim 14, wherein the second variable resistance means comprises a region of silicon doped with an impurity comprising phosphorous.

19. The electrical circuitry of claim 14, wherein the first voltage signal and the second voltage signal are the same.

20. The memory device of claim 14, further comprising first transfer means connected to the output node of the first inverter means, wherein the first transfer means receives the first voltage signal for controlling transfer of a voltage signal output by the first inverter means.

21. The memory device of claim 14, further comprising second transfer means connected to the output node of the second inverter means, wherein the second transfer means receives the first voltage signal for controlling transfer of a voltage signal output by the second inverter means.

22. The memory device of claim 14, wherein the first inverter means comprises a first transistor having a gate terminal, a source terminal and a drain terminal, and the first inverter means further comprises a second transistor having a gate terminal, a source terminal and a drain terminal, wherein the gate terminal of the first transistor is connected to the gate terminal of the second transistor, wherein the drain terminal of the first transistor is connected to the drain terminal of the second transistor, and wherein the source terminal of the first transistor is connected to a first voltage potential and the source terminal of the second transistor is connected to a second voltage potential, and wherein the drain terminal of the first transistor is connected to the drain terminal of the second transistor to form an output node of the first inverter means, wherein the output node of the first inverter means is connected to the first transfer means.

23. The electrical circuitry of claim 22, wherein the first and the second variable resistance means are formed in the same silicon layer as the gate terminals of the first transistor and the second transistor.

24. The electrical circuitry of claim 13 further comprising an insulator layer located above the first variable resistance means and below an electrically conductive region.

25. The electrical circuitry of claim 24 wherein the insulator layer is a dielectric oxide.

26. A variable resistor disposed between an output node of a first inverter and an input node of a second inverter on a semiconductor substrate, the variable resistor comprising:

a polysilicon layer over the semiconductor substrate, the polysilicon layer having a variable resistor region that is doped with an impurity to form a predetermined resistivity;

an electrically conductive region over the variable resistor region; and, a dielectric oxide layer between the polysilicon layer and the electrically conductive region, wherein the resistivity of the variable resistor region can be adjusted by applying a voltage signal to the electrically conductive region.

27. The variable resistor of claim 26, wherein the electrically conductive region comprises polysilicon.

28. The variable resistor of claim 26, wherein the electrically conductive region comprises aluminum.

29. The variable resistor of claim 26, wherein the electrically conductive region has a thickness of about 500 to 5000 Angstroms.

30. The variable resistor of claim 26, wherein the electrically conductive region has a thickness of about 1000 Angstroms.

31. The variable resistor of claim 26, wherein the electrically conductive region has substantially the same width as the variable resistor region and is positioned over the variable resistor region.

32. The variable resistor of claim 26, wherein the impurity is implanted in the variable resistor region at a dose ranging from $1 \times 10^{13}$ to $1 \times 10^{16}$ atoms/cm$^3$, and an energy level in the range of 15 keV to 60 keV.

33. The variable resistor of claim 26, wherein the impurity comprises phosphorous.

34. The variable resistor of claim 26, wherein the impurity comprises arsenic.

35. The variable resistor of claim 26 wherein the dielectric oxide layer comprises silicon dioxide.

36. A memory device comprising:

first and second inverters, each having an input node and an output node;

a first variable resistor connected between the output node of the first inverter and the input node of the second inverter, wherein the first variable resistor comprises a first region of silicon doped with an impurity to form a predetermined resistivity, and the resistivity of the first variable resistor can be varied by applying an electrical charge over the first region of silicon in accordance with a first voltage signal; and a second variable resistor, connected between the output node of the second inverter and the input node of the first inverter, wherein the second variable resistor comprises a second region of silicon doped with an impurity to form a predetermined resistivity, and the resistivity of the second variable resistor can be varied by applying an electrical charge over the second region of silicon in accordance with a second voltage signal.

37. The electrical circuitry of claim 36 further comprising an insulator layer located above the first variable resistor and below an electrically conductive region.

38. The electrical circuitry of claim 37 wherein the insulator layer is a dielectric oxide.

* * * * *